United States Patent [19]
Hermstein et al.

[11] 3,939,412
[45] Feb. 17, 1976

[54] VOLTAGE MEASURING DEVICE FOR AN ENCAPSULATED HIGH-VOLTAGE SWITCHING INSTALLATION

[75] Inventors: Wolfgang Hermstein, Nurnberg; Gerhard Rosenberger; Willi Muller, both of Berlin, all of Germany

[73] Assignee: Siemens Aktiengesellschaft, Munich, Germany

[22] Filed: Aug. 8, 1974

[21] Appl. No.: 495,820

[30] Foreign Application Priority Data
Aug. 10, 1973 Germany............................ 2341073

[52] U.S. Cl.................... 324/96; 324/60 C; 324/97; 324/72; 350/150
[51] Int. Cl.[2]........................................ G01R 31/00
[58] Field of Search ......... 324/96, 95, 72, 87, 60 C, 324/60 R, 97; 350/150, 151

[56] References Cited
UNITED STATES PATENTS

| | | | |
|---|---|---|---|
| 3,175,151 | 3/1965 | Gurry................................ | 324/60 R |
| 3,253,207 | 5/1966 | Jauch................................ | 324/72 X |
| 3,543,151 | 11/1970 | Pelenc et al. ...................... | 324/96 |
| 3,810,013 | 5/1974 | Muller................................ | 324/96 |

FOREIGN PATENTS OR APPLICATIONS

| | | | |
|---|---|---|---|
| 942,255 | 2/1947 | France............................... | 324/60 |

*Primary Examiner*—Saxfield Chatmon, Jr.
*Attorney, Agent, or Firm*—Kenyon & Kenyon Reilly Carr & Chapin

[57] ABSTRACT

A voltage measuring device for use with an encapsulated, high-voltage switching installation including an inner conductor within a grounded metallic outer tube. The measuring device includes means for widening the outer tube, thereby providing a space for locating certain portions of the measuring device. Positioned in the space formed by the widening means is an auxiliary electrode means, insulated from the outer tube, which forms a capacitor with the inner conductor. Measuring means and servo-indicating means are connected in various ways to the capacitor formed by the auxiliary electrode means and the inner conductor. These measuring means respond to variations in the electrical characteristics of the capacitor thus formed to thereby give an indication of the voltage of the inner conductor.

14 Claims, 5 Drawing Figures

VOLTAGE MEASURING DEVICE FOR AN ENCAPSULATED HIGH-VOLTAGE SWITCHING INSTALLATION

BACKGROUND OF THE INVENTION

1. Field of the Invention

This invention relates to a voltage measuring device, which is particularly adapted for measuring high-voltages on encapsulated switching installations containing an inner conductor within a grounded metallic outer tube.

2. Description of the Prior Art

Previous methods for monitoring the voltage of high-voltage switching installations generally employed voltage transformers. A typical system is described in Deutsche Auslegungschrift No. 1,807,997. There a high-voltage system is described which employs a voltage transformer where the high voltage coil is located inside an insulating body, with core and the coils of the transformer located in a hermetically sealed, pressurized tank. The tank is filled with insulating gas and is secured to the metallic outer tube of the switching installation by a suitably flanged, gas-tight connection. The principal mode of operation for the transformer type measuring device is, of course, essentially inductive.

A voltage transformer of the type described in Deutsche Auslegungschrift No. 807,997 is only suitable for voltage ratings below a certain level. Higher voltages would require transformer designs which would need too much space. Split iron core transformers, alternately, although possibly handling the higher voltages, are relatively poor performing devices. Further, transformers for higher voltage rating installations become expensive when they must be designed to be made surge proof and free of partial discharge. A voltage transformer for completely insulated, metal clad high-voltage switching installations is described in Deutsche Offenlegungsschrift No. 2,125,297.

It is therefore a primary object of this invention to provide a voltage measuring device for application in high-voltage switching installations which is relatively simple in construction and consequently favorably cost.

SUMMARY OF THE INVENTION

A voltage measuring device for use with an encapsulated, high-voltage switching installation including an inner conductor within a grounded metallic outer tube. The measuring device includes means for widening the outer tube, thereby providing a space for locating certain portions of the measuring device. Positioned in the space formed by the widening means is an auxiliary electrode means, insulated from the outer tube, which forms a capacitor with the inner conductor. Measuring means and servo-indicating means are connected in various ways to the capacitor formed by the auxiliary electrode means and the inner conductor. These measuring means respond to the variations in the electrical characteristics of the capacitor thus formed to thereby give an indication of the inner conductor.

In one embodiment, the auxiliary electrode means comprises an electrode which is arranged in the space formed by the widening means which is insulated from the outer tube and located at a distance which is approximately the same as the distance between the inner conductor and the outer tube. The measuring means operatively connected to the electrode include a capacitor which together with the effective capactior formed between the inner conductor and the auxiliary electrode, forms a voltage dividing network for the voltage between the inner tube and the outer tube. The voltage developed across the capacitor connected between the auxiliary electrode and the outer tube is monitored by various means. The various measuring devices may include an indicating, glow-discharge lamp connected in parallel across the capacitor which lights when the voltage on the capacitor, and thus the voltage on the inner conductor, is at its proper value. An observation window can be provided in the area of the widening which allows the lamp to be observed. Further, the voltage on the capacitor can be supplied to remote indicating devices which enable a central monitoring of various readings from various points in the installation. These remote devices can include a cathode-ray oscilloscope with sufficiently high impedance. Also, analog or digital computers can be connected through suitable matching amplifiers, to the capacitor to thereby provide a continuous monitoring and processing of data from the various devices in the installation. In the case of the remotely located monitoring devices, a feedthrough is provided in the widening means to enable suitable connections to the capacitor.

Other embodiments described, responsive to the voltage developed across the capacitor, include the use of an electro-optical instrument which is operatively connected to the capacitor. A source of polarized light is directed to the instrument which shifts the plane of polarization as a function of the voltage on the capacitor. An evaluation device receives the light exiting from the instrument and produced a current proportional to the shifting of the plane of polarization and thus the voltage on the capacitor. Two such instruments capable of operation with the embodiment described are the Kerr cell and the Pockels cell. The size of the equipment involved employing the electro-optical instrument are such that they can be positioned within the space defined by the widening means. This affords a protection for these delicate instruments. However, where space limitations restrict the size of the widening device, the polarized light source and the optical evaluation device can be positioned outside the widening and the light from the source entering the widening and the light exiting from the instrument and directed towards the evaluation device can be brought into the area of the widening through two windows.

Two alternate embodiments employing the principals of invention are also described. In one of these, the auxiliary electrode includes an opening, the electrode forming a part of an electrostatic voltage measuring device, well known in art. A metal disc is pivotally mounted in the opening. Attached to the back side of the disc is a mirror which reflects light from a suitable light source onto a calibrated scale positioned in a suitable location in the space defined by the widening means. Through the electrostatic forces generated between the inner conductor and the metal disc affixed to the auxilliary electrode, the disc rotates in proportion thereto and thus the voltage on the inner conductor. The reflected light moves along the calibrated scale to give an indication of the voltage. The basic design for such an electrostatic voltage measuring device is described in a book, authored by A. J. Schwab in 1969 and entitled "Hochspannungsmesstechnik" (High-Voltage Measuring Technology), see page 82.

In the other embodiment, the auxiliary electrode forms one of the stationary electrodes of a generator volt meter whose operation is also known in the art. The other stationary electrode which is required by this technique is formed by a supplementary electrode housed in the widening. The required rotating electrode is formed by a sector disc which is mounted on the shaft of a synchronous motor housed in the space defined by the widening means. The basic design and operation of such a device is described in the aforementioned book by A. J. Schwab at page 121.

The widening means employed would comprise a stub which is secured to the grounded metallic outer tube and which is accessible to the outside through an opening which under normal circumstances is closed off by a suitably shaped flange.

BRIEF DESCRIPTION OF THE DRAWINGS

Reference is now made to the accompanying drawings for a better understanding of the nature and objects of the invention. The drawings illustrate the best mode presently employed for carrying out the objects of the invention and its principles, and are not to be construed as restrictions or limitations on its scope.

FIG. 1 describes one embodiment employing the principles of the invention. The drawing shows a high-voltage switching installation which comprises an inner conductor 2 concentrically disposed within a metallic outer tube 3. Secured to the outer tube 3 is a widening means 4 which is also metallic and which is secured to the outer tube in a suitable manner. The widening means 4 defines a space 6 which communicates with the interior space 7 between the inner conductor and the outer tube. Positioned in the space 6 is auxiliary electrode means which, in FIG. 1, is an electrode 8 which is mounted in the space 6 at a distance from the conductor 2 approximately equal to the distance between the conductor 2 and the tube 3. The electrode 8 is insulated from the tube 3 by its mounting. The method of mounting the electrode 8 can be done in many ways, known in the art, which are not illustrated for purposes of clarity.

Figure 1:
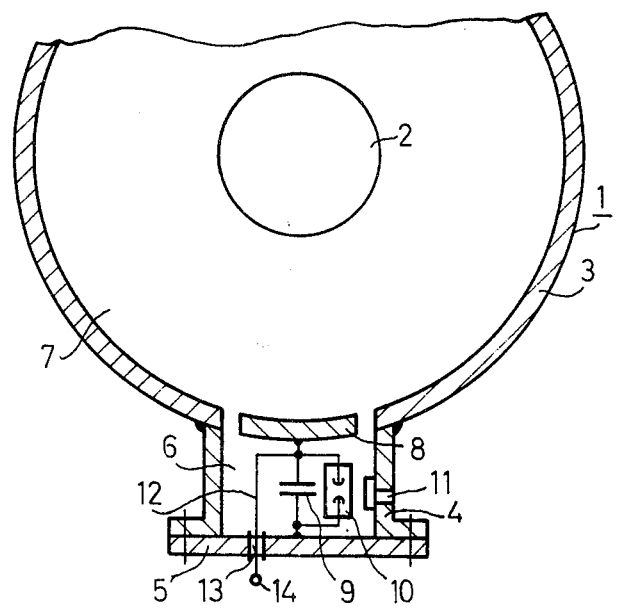
FIG. 1 is an electric schematic diagram of a voltage measuring device according to the invention wherein an auxiliary electrode is arranged at a metal stub. An indicator in the form of a glow-discharge lamp is connected to the auxiliary electrode.

The auxiliary electrode 8 and the conductor 2 form a first capacitor. Electrically connected to the auxiliary electrode 8 is a second capacitor 9. The other end of the capacitor 9 is connected to the metallic tube 3 via a connection to a flange 5 which seals off the widening means or stub 4 from the outside. Since the flange 5, the stub 4 and the tube 3 are all metal, the necessary connection of the remaining side of capacitor 9 to the metal tube 3 is effected.

The second capacitor 9, and the capacitor formed by the inner conductor 2 and the auxiliary electrode 8, in effect, have the voltage appearing on conductor 2, relative to the grounded tube 3 appearing across themselves. They form, in effect, a capacitive voltage divider. The value of capacitor 9 is selected such that the voltage dropped across its terminals is lower than the voltage across the capacitor formed by the electrode 8 and the inner conductor 2.

Various means can be employed to measure the voltage across the capacitor 9, and thereby give an indication of the voltage of the inner conductor 2 relative to the tube 3. Such an indicating device is the glow-discharge lamp 10 shown connected in parallel across the terminals of capacitor 9. The stub 4 is provided with a viewing window 11 through which an observer can detect whether or not the lamp is illuminated. Thus the voltage of the installation can be monitored without the necessity of providing additional equipment external to the space 6 provided by the stub 4.

Alternatively, if it is desired to monitor the voltage across the terminals of capacitor 9 at some remote location, the flange 5 or the stub 4 can be provided with the feedthrough 13 which enables an electrical conductor to be connected from the junction of the capacitor 9 and the electrode 8 to the outside. This conductor, 12, would terminate in an external terminal 14. Alternate monitoring means such as a cathode-ray oscilloscope having suitably high input impedance or other measuring devices having their input impedance raised through suitable matching amplifiers, can be connected to terminal 14.

Figure 4:
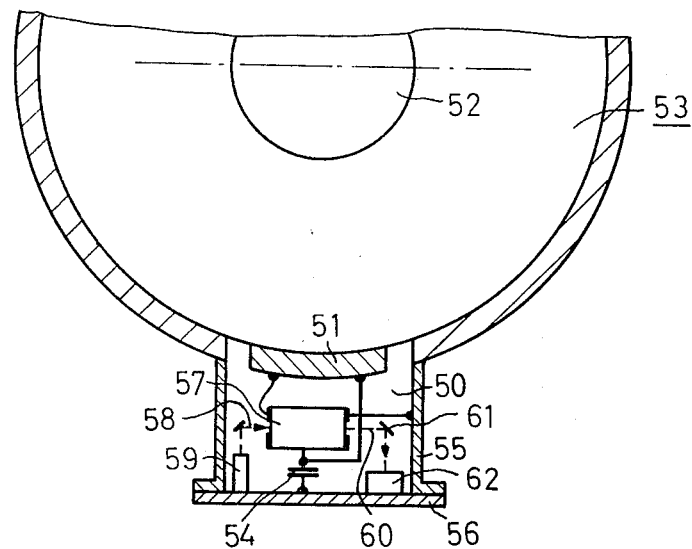
FIG. 4 is a further embodiment of the invention wherein an electro-optical device is used to afford an indication of the voltage on the inner conductor of the high-voltage installation.
Figure 5:
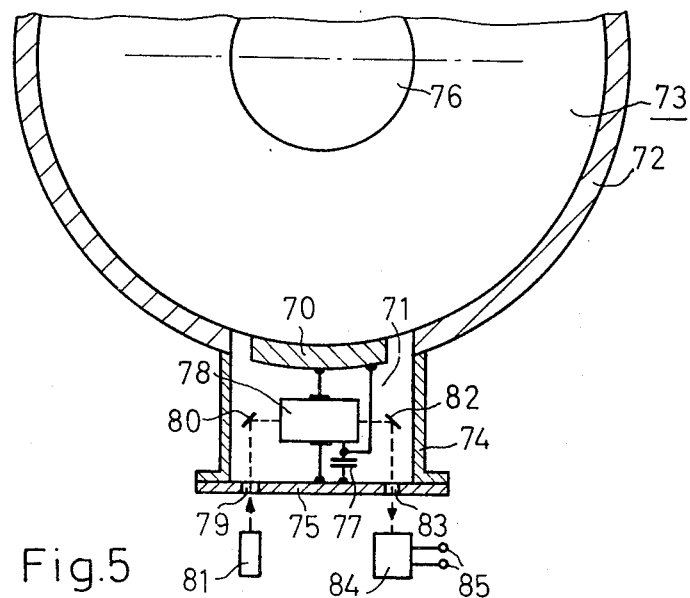
FIG. 5 is another embodiment of the invention wherein an electro-optical device such as a Kerr cell is utilized for providing an indication of the voltage on the inner conductor of the high-voltage installation.

FIGS. 4 and 5 disclose a variation of the embodiment of FIG. 1 wherein the indicating means is an electro-optical device. Referring to FIG. 4, auxiliary electrode 51 positioned in space 50, defined by stub 55 and flange 56, forms a first capacitor with the inner tube 52. A second capacitor 54 is connected between the electrode 51 and the flange 56, which is, in effect, electrically connected to tube 53. Again, capacitor 54 has a value such that it forms the low voltage leg of a capacitive voltage divider formed by the capacitor between the electrode 51 and the inner conductor 52 and the capacitor 54.

In this embodiment, the junction between the two capacitors is connected to an electro-optical instrument. A source of polarized light is supplied by a light source 59. Such a source might be, for instance, a laser. The light beam 58 is directed into the instrument 57 which might be a Pockel cell, well known in the art. The exiting light beam 60 is shifted in its plane of polarization by the cell 57. This shifting depends on the voltage across the capacitor 54 and is effected within the cell 57 in a manner known in the art. The exiting beam 60 is directed by a deflection mirror 61 into an optical evaluation device 62 which, also, is well known in the art. The evaluation device 62 provides an electrical output which is proportional to the shift in the plane of polarization of the light emanating from light source 59 and is thus proportional to the voltage across the capacitor 54 and in turn the high voltage of conductor 52 relative to the grounded tube 63. The electrical output of the evaluation device 62 can be provided to monitoring equipment external to the 50 through appropriate feedthrough terminals positioned in the stud 55. These have not been shown for purposes of clarity but would be similar in nature to item 13 in FIG. 1.

A similar arrangement employing an electro-optical instrument is shown in FIG. 5. There the auxiliary electrode 70 forms the first capacitor with inner conductor 76 and a second capacitor 77 is connected between the electrode 70 and the flange 75 which is electrically common to outer tube 72 via its conection through stub 74. In this embodiment, only the electro-optical instrument, such as a Kerr cell 78 is positioned in the space 71 defined by the stub 74. Deflection mirrors 80 and 82 direct the polarized light entering and exiting from the instrument 78 from outside of the space 71. The polarized light source 81 supplies a beam of light through a window 79 in the flange 75. The beam is deflected from the mirror 80 into the instrument 78. The exiting light beam from the instrument 78, shifted in its plane of polarization by an amount which is a function of the voltage across the capacitor 77, is deflected out of the area of the space 71 by the mirror 82. The exiting, deflected beam passes through a second window 83 and is then received by the evaluation device 84. The device 84, again, produces at its terminals 85 an electrical quantity proportional to the voltage on the capacitor 77 and in turn, the voltage on the conductor 76 relative to ground.

Figure 2:
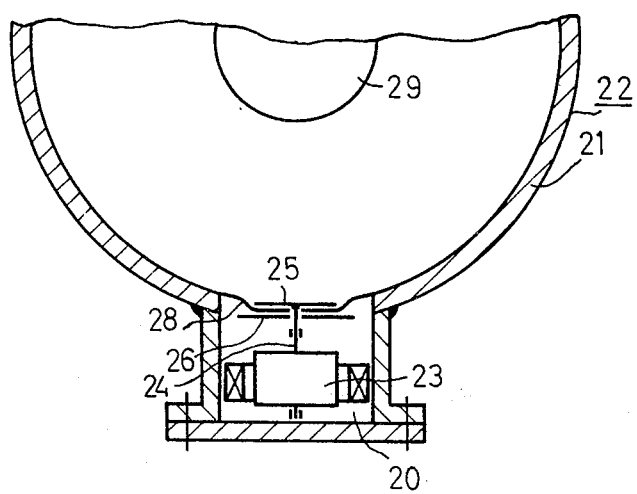
FIG. 2 illustrates an alternate embodiment of the invention wherein a synchronous motor is utilized to afford an indication of the voltage potential on the inner conductor of the high-voltage installation.

FIG. 2 represents an alternate approach to the capacitive voltage divider schemes of FIGS. 1, 4 and 5. In FIG. 2, a synchronous motor 23 is positioned in the space 20 formed in a manner similar to that described with the aforementioned embodiments. The synchronous motor 23 has attached to its shaft 24 a rotating sector disc 25. An auxiliary electrode 26 is positioned in the opening or space 20 and is mounted, but insulated from, the outer tube 21. A supplementary electrode 28, connected to the outer tube and hence grounded, is interposed between the rotating sector disc 25 and the auxiliary electrode 26. The electrode 26 and 28 include openings suitable to allow passage of the shaft 24 therethrough.

The auxiliary electrode 26 and the supplementary electrode 28 form the stationary electrodes associated with a measuring device known as a measuring generator. The basic design of such a device, not shown, is in accordance with the description of a high-voltage meter setforth in the aforementioned book by A. J. Schwab, page 121. Further details of the measuring generator device which are known in the art, and which are not shown for purposes of clarity, include a tapping resistor as well as an amplifier and indicating instrument connected thereto. These all would be connected to the stationary electrodes 26 and 28, as well as current connections for the synchronous motor 23, through suitable feedthrough contacts not shown.

To understand the mode of operation of the embodiment of FIG. 2, it should be understood that the electrode 26 and inner conductor 29 form a capacitor. The capacity of this capacitor formed by the electrode 26 and the conductor 29 changes in a periodic manner due to the rotation of the sector disc 25 at the synchronous speed of the motor 23. The change in capacity is also a function of the voltage potential of the conductor 29. The periodic change in capacity results in a proportional current flowing in the tapping resistor not shown. This current through the tapping resistor is processed by a suitably adapted amplifier and indicating instrument to thereby give an indication of the voltage potential of the conductor 29.

Figure 3:
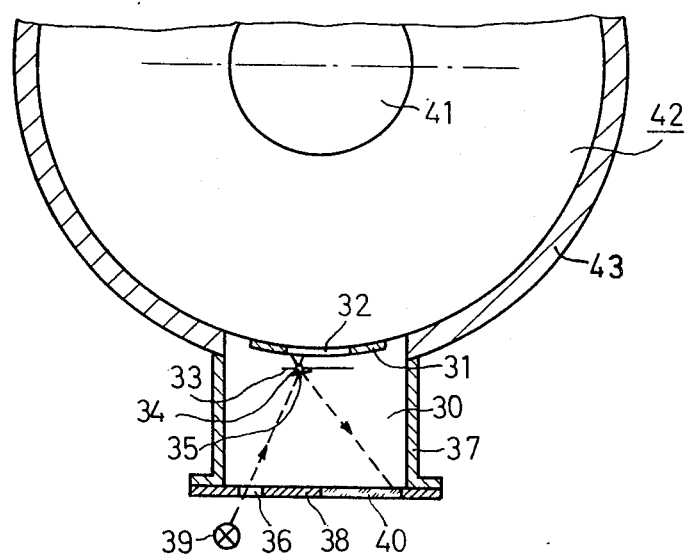
FIG. 3 illustrates still another embodiment of the invention wherein a rotatable disc is mounted on the auxiliary elctrode on which, in turn, is mounted a mirror. The rotation of the disc and mirror is indicative of the voltage appearing between the inner conductor and enclosure of the high-voltage installation.

FIG. 3 represents yet another embodiment employing the principles of the invention. There an auxiliary electrode 31 is positioned in space 30 and includes an opening 32. Pivotally mounted to the electrode 31, behind the electrode, is a metallic disc 33. Secured to the back side of the disc 33 is a mirror 35. Located external to the space 30 is a light source 39 which directs its beam through window 36 in flange 38 at the mirror 35. The mirror 35 deflects the beam emanating from source 39 towards a calibrated scale 40 which is disposed in the flange 38. The scale generally is transparent, which allows for a reading thereof from outside the space 30. The rotational mounting of the disc 33 is such that it rotates in proportion to the force exerted on the metal disc due to the electric field between the conductor 41 and the auxiliary electrode 31. The electric field is a function of the voltage between the inner conductor 41 and the electrode 31 which is electrically connected to the outer tube 43. Again, the amount of rotation of the disc 33 is proportional to the voltage. Of course, the mirror rotates as the disc rotates such that the beam from source 39 moves along the calibrated scale 40 in a manner which reflects the amount of rotation of the disc 33. Thus, a means is established for detecting the voltage potential of the conductor 41 relative to the tube 43.

It is to be appreciated that changes in the above embodiments can be made without departing from the scope of the present invention. Variations of the specific construction disclosed can be made by those skilled in the art, but these must be considered within the scope of the claims appended hereto.

What is claimed is:

1. A voltage measuring device for use with an encapsulated, high-voltage switching installation including an inner conductor within a grounded metallic outer tube, which comprises:
    a. means for widening said outer tube to thereby form a space for locating certain portions of said measuring device;
    b. auxiliary electrode means positioned in said space so as to separate said space from an inner space defined by the outer tube and the inner conductor electrically insulated from the outer tube, said auxiliary electrode means and said inner conductor forming a first capacitor; and,
    c. means operatively connected to said first capacitor for responding to electrical characteristics of said first capacitor to thereby give an indication of the voltage of said installation.

2. The voltage measuring device of claim 1, wherein said auxiliary electrode means is positioned at approximately the same distance from said inner conductor as is said outer tube.

3. A voltage measuring device for use with an encapsulated, high-voltage switching installation including an inner conductor within a grounded metallic outer tube, which comprises:
    a. means for widening said outer tube to thereby form a space for locating certain portions of said measuring device;
    b. auxiliary electrode means positioned in said space, said auxiliary electrode means and said inner conductor forming a first capacitor; and, c. means operatively connected to said first capacitor and adapted to respond to electrical characteristics of said first capacitor to thereby give an indication of the voltage of said installation, said operatively connected means including: a second capacitor connected between said auxiliary electrode means and said metallic outer tube, said first and second capacitor forming a voltage divider between said inner conductor and said grounded metallic tube, said second capacitor having a capacitance value such that the voltage across said second capacitor is lower than that across said first capacitor; and, indicating means connected to said second capacitor and adapted to respond to the voltage developed across said second capacitor.

4. The voltage measuring device of claim 3, wherein said indicating means consists of a glow - discharge lamp connected in parallel across said second capacitor.

5. The voltage measuring device of claim 4, wherein said glow - discharge lamp is positioned in said space and wherein said widening means includes an observation window for viewing said lamp.

6. The voltage measuring device of claim 3, wherein said indicating means is positioned outside said outer tube and wherein said widening means further includes feedthrough means through which said indicating means is connected to said second capacitor.

7. The voltage measuring device of claim 1, wherein said auxiliary electrode means includes:
  a. an electrode having an opening;
  b. a metal disc pivotally mounted to said electrode and positioned such that said disc rotates in response to the electric field forces exerted between said inner conductor and said disc, and
  c. means for measuring the rotational movement of said disc to thereby give an indication of the voltage between said inner conductor and said outer tube.

8. A voltage measuring device for use with an encapsulated, high-voltage switching installation including an inner conductor within a grounded metallic outer tube, which comprises:
  a. means for widening said outer tube to thereby form a space for locating certain portions of said measuring device;
  b. auxiliary electrode means positioned in said space, said auxiliary electrode means and said inner conductor forming a capacitor, said auxiliary electrode means including: an electrode having an opening; and, a metal disc pivotally mounted to said electrode and positioned such that said disc rotates in response to the electric field forces exerted between said inner conductor and said disc; and,
  c. means for measuring the rotational movement of said disc to thereby give an indication of the voltage between said inner conductor and said outer tube, said means for measuring the rotational movement includes: a mirror secured to said disc; a source of light directed at said mirror; and calibrated scale means onto which light reflected from said mirror is displayed.

9. The voltage measuring device of claim 1, wherein said means operatively connected to said first capacitor include a voltage measuring generator having first and second stationary electrodes and a rotating electrode, said first stationary electrode forming said first capacitor with said inner conductor, said rotating electrode causing a periodic change in the capacity of said first capacitor which varies the output current of said generator in proportion thereto.

10. The voltage measuring device of claim 3, wherein said indicating means includes:
  a. an electro-optical instrument operatively connected to said second capacitor;
  b. a source of polarized light directed towards said instrument, said instrument shifting the plane of polarization of said light in proportion to the voltage of said second capacitor; and
  c. an optical evaluation device for monitoring the polarized light exiting from said instrument, said evaluation device producing an indication proportional to the shifting of the plane of polarization of said light.

11. The voltage measuring device of claim 10, wherein said instrument is a Kerr cell.

12. The voltage measuring device of claim 10, wherein said instrument is a Pockels cell.

13. The voltage measuring device of claim 10, wherein said instrument, said source of polarized light and said evaluation device are positioned in said space.

14. The voltage measuring device of claim 1, wherein said means for widening said outer tube comprises a metallic stub positioned in said outer tube and a metal flange, connected to said stub to thereby seal the stub from the outside.

* * * * *

UNITED STATES PATENT AND TRADEMARK OFFICE
CERTIFICATE OF CORRECTION

PATENT NO. : 3 939 412
DATED : February 17, 1976
INVENTOR(S) : Wolfgang Hermstein et al It is certified that error appears in the above-identified patent and that said Letters Patent are hereby corrected as shown below:

In column 1, line 29, insert the number --1-- before "807 997"

In column 2, line 2, change "capactior" to --capacitor--

In column 2, line 34, change "produced" to --produces--

In column 3, between the lines 47 and 48 insert --DESCRIPTION OF THE PREFERRED EMBODIMENTS--

Signed and Sealed this twenty-ninth Day of June 1976

[SEAL]

Attest:

RUTH C. MASON
Attesting Officer

C. MARSHALL DANN
Commissioner of Patents and Trademarks